(12) United States Patent
Han et al.

(10) Patent No.: US 10,658,516 B2
(45) Date of Patent: May 19, 2020

(54) THIN FILM TRANSISTOR, ARRAY SUBSTRATE, METHOD FOR MANUFACTURING THE SAME, AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Junhao Han, Beijing (CN); Bingkun Yin, Beijing (CN); Jun Ma, Beijing (CN); Min Zhang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 90 days.

(21) Appl. No.: 15/169,021

(22) Filed: May 31, 2016

(65) Prior Publication Data

US 2017/0345943 A1 Nov. 30, 2017
US 2018/0166584 A9 Jun. 14, 2018

(30) Foreign Application Priority Data

Jun. 15, 2015 (CN) .......................... 2015 1 0332661

(51) Int. Cl.
*H01L 29/786* (2006.01)
*H01L 29/45* (2006.01)
(Continued)

(52) U.S. Cl.
CPC .. *H01L 29/78669* (2013.01); *H01L 21/28518* (2013.01); *H01L 29/0847* (2013.01);
(Continued)

(58) Field of Classification Search
CPC ......... H01L 21/28052; H01L 21/76889; H01L 21/823418; H01L 29/6675;
(Continued)

(56) References Cited

U.S. PATENT DOCUMENTS 6,620,719 B1 * 9/2003 Andry ............... H01L 29/41733
257/E21.413
6,956,236 B1 * 10/2005 Sasaki ............... G02F 1/136286
257/59

(Continued)

FOREIGN PATENT DOCUMENTS

CN 2011068340 A 5/2015
TW 200644253 A 12/2006

OTHER PUBLICATIONS

May 22, 2017—(CN) First Office Action Appn 201510332661.9 with English Tran.

*Primary Examiner* — Sue A Purvis
*Assistant Examiner* — Scott Stowe
(74) *Attorney, Agent, or Firm* — Banner & Witcoff, Ltd.

(57) ABSTRACT

Disclosed is a thin film transistor, an array substrate, a method for manufacturing the same, and a display device. The method includes: forming a source and drain on a base substrate and forming a semiconductor layer. Between the step of forming the source and drain and the step of forming the semiconductor layer, the method further includes: forming a diffusion barrier layer. Metal atoms diffused from the source and drain and passing through the diffusion barrier layer react with a part of the semiconductor layer near the source and drain, and a metal transition layer containing metal silicide is formed.

18 Claims, 3 Drawing Sheets

(51) Int. Cl.
*H01L 21/285* (2006.01)
*H01L 29/08* (2006.01)
*H01L 29/66* (2006.01)
*H01L 29/78* (2006.01)

(52) U.S. Cl.
CPC ...... *H01L 29/458* (2013.01); *H01L 29/66765* (2013.01); *H01L 29/7845* (2013.01); *H01L 29/78618* (2013.01)

(58) Field of Classification Search
CPC ......... H01L 29/66765; H01L 29/78618; H01L 29/458; H01L 29/41733
See application file for complete search history.

(56) References Cited

U.S. PATENT DOCUMENTS

| | | | |
|---|---|---|---|
| 7,687,333 B2 | 3/2010 | Yang et al. | |
| 2011/0068340 A1 | 3/2011 | Lee et al. | |
| 2011/0121297 A1* | 5/2011 | Kawakami | G02F 1/136286 |
| | | | 257/52 |
| 2013/0026470 A1* | 1/2013 | Terao | H01L 21/28518 |
| | | | 257/52 |
| 2016/0042959 A1* | 2/2016 | Lee | H01L 21/28518 |
| | | | 257/72 |

* cited by examiner

THIN FILM TRANSISTOR, ARRAY SUBSTRATE, METHOD FOR MANUFACTURING THE SAME, AND DISPLAY DEVICE

This application claims priority to and the benefit of Chinese Patent Application No. 201510332661.9 filed on Jun. 15, 2015, which application is incorporated herein in its entirety.

TECHNICAL FIELD

Embodiments of the present disclosure relate to a technical field of electronic technology, especially relate to a thin film transistor, an array substrate, a method for manufacturing the same, and a display device.

BACKGROUND

In the field of liquid crystal displays, switch-on current (the current of an active layer while a Thin Film Transistor (TFT) is turned on by applying voltage to a gate) of the TFT is of great significance to TFT's performance and is inversely proportional to a resistance of the TFT while it is turned on (that is, switch-on resistance $R_{on}$).

Typically, an array substrate is produced by using a back-channel-etched bottom-gate TFT, and the switch-on resistance of the TFT is described by the model shown in FIG. 1, that is:

$$R_{on} = 2*R_{\Omega} + 2*R_v + R_c.$$

Wherein $R_{on}$ is the switch-on resistance of the TFT, $R_{\Omega}$ is an ohmic contact resistance between an active layer 01 and a source 02 (or a drain 03), $R_v$ is a longitudinal resistance of the active layer 01, $R_c$ is a channel resistance while the TFT is turned on. It can be seen that, the switch-on resistance $R_{on}$ of the TFT can be reduced effectively by reducing $R_{\Omega}$, $R_v$ or $R_c$.

Currently, in order to obtain a higher value of the switch-on current, the channel resistance $R_c$ may be reduced by increasing the ratio of width to length (W/L) of the TFT channel. However, when the W/L of the TFT channel is greater than a certain threshold, an aperture ratio of a display device (the ratio of the effective transmission area to the whole area) will be decreased, accordingly, an energy consumption of the display device will be increased.

SUMMARY

In first respect of the present disclosure, there is provided a method for manufacturing a thin film transistor, which comprises: forming a source and drain on a base substrate and forming a semiconductor layer; between forming the source and drain and forming the semiconductor layer, the method further comprises: forming a diffusion barrier layer, wherein metal atoms diffused from the source and drain and passing through the diffusion barrier layer react with a part of the semiconductor layer near the source and drain, and a metal transition layer containing metal silicide is formed.

In second respect of the present disclosure, there is provided a method for manufacturing an array substrate, which comprises the above method for manufacturing the thin film transistor.

In third respect of the present disclosure, there is provided a thin film transistor, which comprises: a base substrate, a source and drain disposed on the base substrate, a diffusion barrier layer disposed on the source and drain, a semiconductor layer disposed on the diffusion barrier layer, wherein metal atoms diffused from the source and drain and passing through the diffusion barrier layer react with a part of the semiconductor layer near the source and drain, and a metal transition layer containing metal silicide is formed.

In forth respect of the present disclosure, there is provided an array substrate, which comprises the above thin film transistor.

In fifth respect of the present disclosure, there is provided a display device, which comprises the above array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
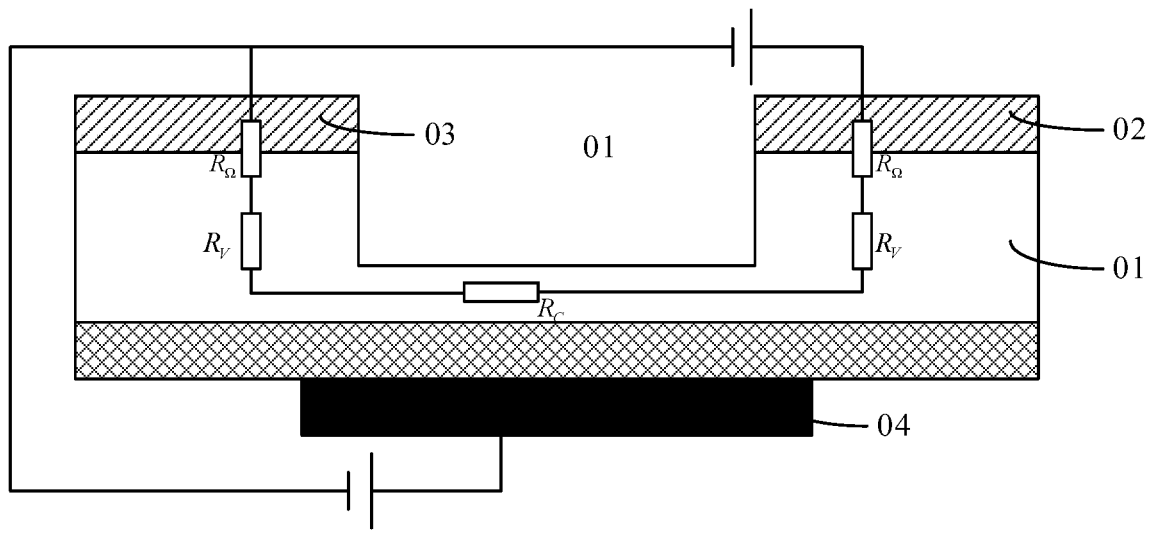
FIG. 1 schematically illustrates a model of switch-on resistance of a TFT.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An embodiment of the present disclosure provides a method for manufacturing a thin film transistor, which comprises: forming a source, a drain and a semiconductor layer on a base substrate. For example, the source and drain contain metal atoms being capable of diffusing; the material of the semiconductor layer is amorphous silicon. Between a step of forming the source and drain and a step of forming the semiconductor layer, the method further comprises: forming a diffusion barrier layer, the diffusion barrier layer is configured to reduce the diffusion ability of metal atoms diffused from the source and drain to the semiconductor layer, such that the metal atoms passing through the diffusion barrier layer contact and react with the amorphous silicon in the semiconductor layer near the source and drain, and a metal transition layer containing metal silicide is formed.

In this way, the metal transition layer containing metal silicide is formed at the interface of the diffusion barrier layer and the semiconductor layer near the source and drain. Because of the low resistivity of the metal silicide, the ohmic contact resistance formed between the semiconductor layer and the source/drain of the TFT is reduced effectively, as a result, the switch-on resistance of the TFT is reduced while the aperture ratio of the display device is guaranteed, and the switch-on current of the TFT is increased.

It should be noted that the sequence of the steps of forming the source and drain, the semiconductor layer and the diffusion barrier layer on the base substrate is not limited in the embodiments of the present disclosure. For example, there is provided two optional exemplarily implements as below.

First scheme: a gate and a gate insulation layer are formed on a base substrate; then a semiconductor layer is formed on the gate insulation layer; next, a diffusion barrier layer is formed on the semiconductor layer; finally, a source and a drain are formed on the diffusion barrier layer.

Second scheme: a gate and a gate insulation layer are formed on a base substrate; then a source and a drain are formed on the gate insulation layer; next, a diffusion barrier layer is formed on the source, the drain and the gate insulation layer; finally, a semiconductor layer is formed on the diffusion barrier layer.

Figure 2:
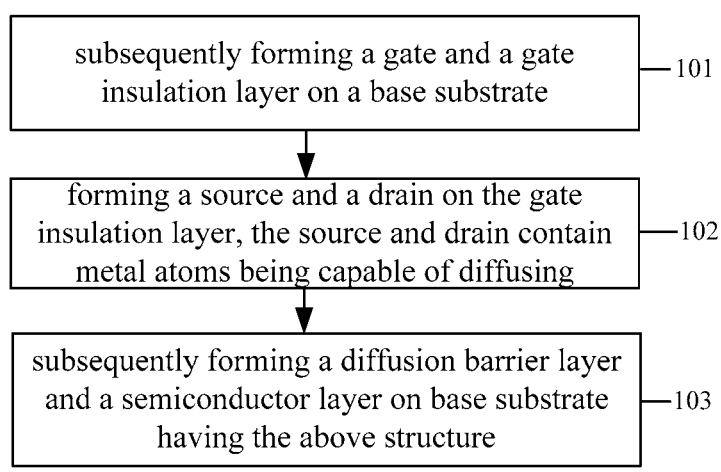
FIG. 2 is a flow chart of a method for manufacturing an array substrate according to an embodiment of the present disclosure.

Exemplarily, as illustrated in FIG. 2, a method for manufacturing the thin film transistor is elaborated below by taking the second scheme as an example, the method comprises:

101. subsequently forming a gate and a gate insulation layer on a base substrate.

Figure 3:
FIG. 3 to FIG. 6 schematically illustrate an array substrate in every step of a method for manufacturing an array substrate according to an embodiment of the present disclosure.

For example, as illustrated in FIG. 3, a gate 11 is formed on a base substrate 10 and a gate insulation layer 12 is formed on the gate 11.

102. forming a source and a drain on the gate insulation layer, the source and drain contain metal atoms being capable of diffusing.

Figure 4:
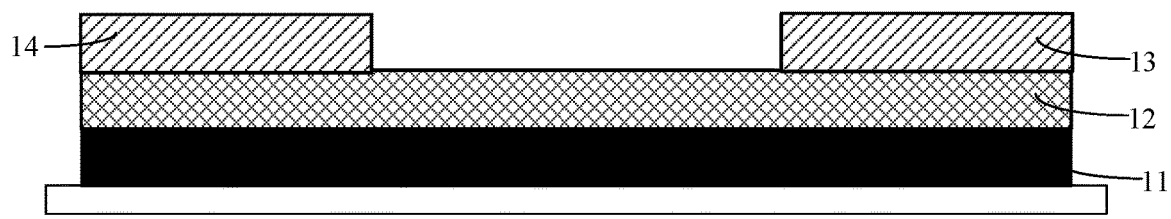

For example, as illustrated in FIG. 4, the source 13 and the drain 14 are formed on the gate insulation layer 12 by a single patterning process.

Because the metal copper has a high thermal conductivity and lower resistivity, it is considered to be an ideal connection material. Meanwhile, copper has a significant diffusion effect, that is, copper atom has a high diffusion rate in most of mediums. In order to avoid a higher ohmic contact resistance due to the excessive diffusion of the copper atom from the source and drain to an active layer to be formed in the following step, a step 103 is further performed.

103. subsequently forming a diffusion barrier layer and a semiconductor layer on base substrate having the above structure in step 102.

For example, the material of the semiconductor layer is amorphous silicon; the diffusion barrier layer is configured to reduce the diffusion ability of metal atoms diffused from the source and drain to the semiconductor layer.

For example, the material of the diffusion barrier layer comprises at least one of tantalum nitride, titanium nitride, molybdenum nitride, silicon oxynitride, or silicon oxide.

Figure 5:
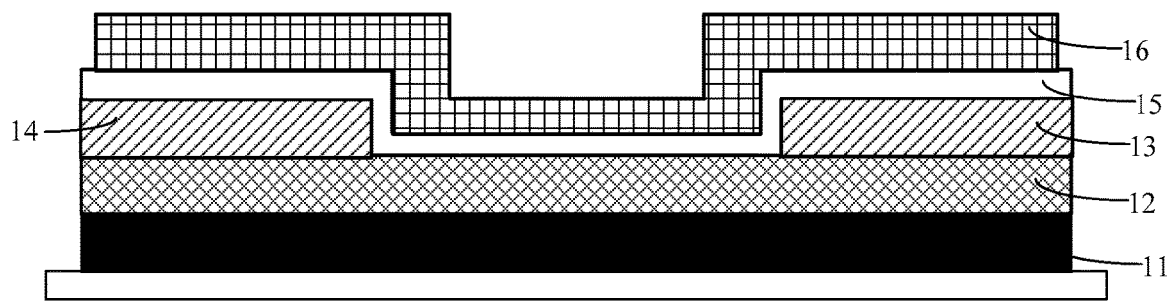
Figure 6:
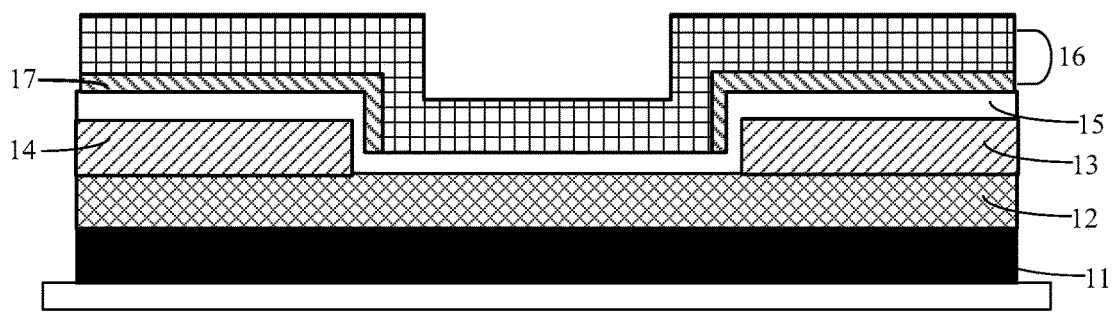

For example, as illustrated in FIG. 5, a diffusion barrier layer 15 and a semiconductor layer 16 are formed in this order on the base substrate 10 having the structure shown in FIG. 4. Taking copper atoms in the source 13 and the drain 14 as an example, because copper atom has a stronger diffusion ability, only a part of copper atoms is blocked by the diffusion barrier layer 15, other copper atoms passing through the diffusion barrier layer 15 may contact and react with the amorphous silicon of the semiconductor layer near the source 13 and the drain 14. As illustrated in FIG. 6, a metal transition layer 17 containing metal silicide (for example, $Cu_3Si$, etc.) is formed at the interface of the diffusion barrier layer 15 and the semiconductor layer 16. At this time, a part of the semiconductor layer 16 becomes the metal transition layer 17, and another part of the semiconductor layer 16 serves as an active layer of the TFT. In other words, the metal transition layer 17 is formed in the part of the semiconductor layer 16 near the diffusion barrier layer 15.

Thus, because the metal silicide has good adhesion with the silicon and has low resistivity, the metal transition layer 17 of the metal silicide plays an ideal role to reduce the ohmic contact resistance.

It should be noted, because the copper atoms in the source 13 and the drain 14 are blocked by the diffusion barrier layer 15, the metal transition layer 17 is formed only at the position of the diffusion barrier layer 15 corresponding to the source 13 and the drain 14 and contacting with the semiconductor layer 16.

Figure 7:
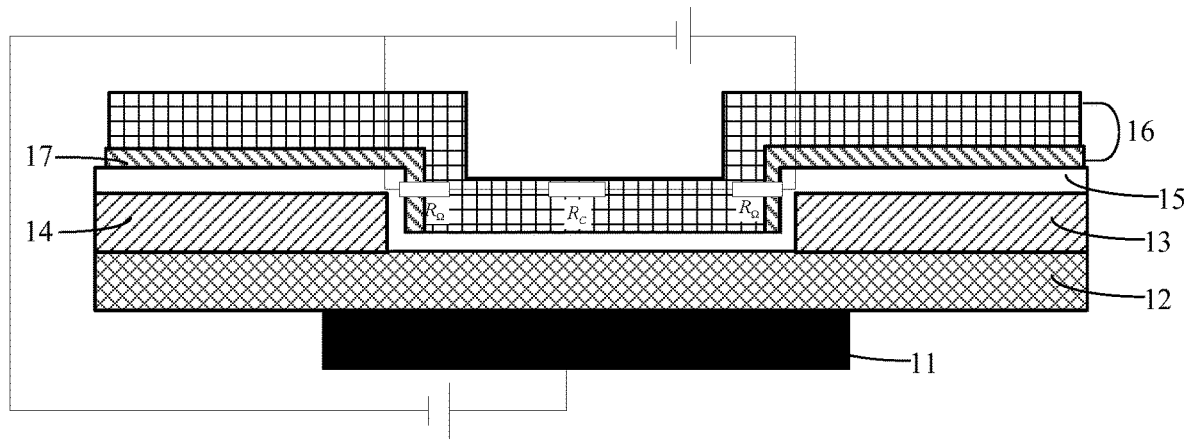
FIG. 7 schematically illustrates a model of switch-on resistance of a TFT according to an embodiment of the present disclosure.

FIG. 7 schematically illustrates a model of switch-on resistance of a TFT according to an embodiment of the present disclosure. The ohmic contact resistance $R_\Omega$ is generated when the metal transition layer 17 contacts with the semiconductor layer 16. The channel resistance $R_c$ is generated when the TFT is turned on, that is, a switch-on resistance of the TFT $R_{on}=2*R_\Omega+R_c$. In comparison of the model of FIG. 1, the ohmic contact resistance $R_\Omega$ is reduced effectively, and a longitudinal resistance of the active layer $R_v$ is omitted. As a result, the switch-on resistance of the TFT is reduced, and the switch-on current of the TFT is increased.

Figure 8:
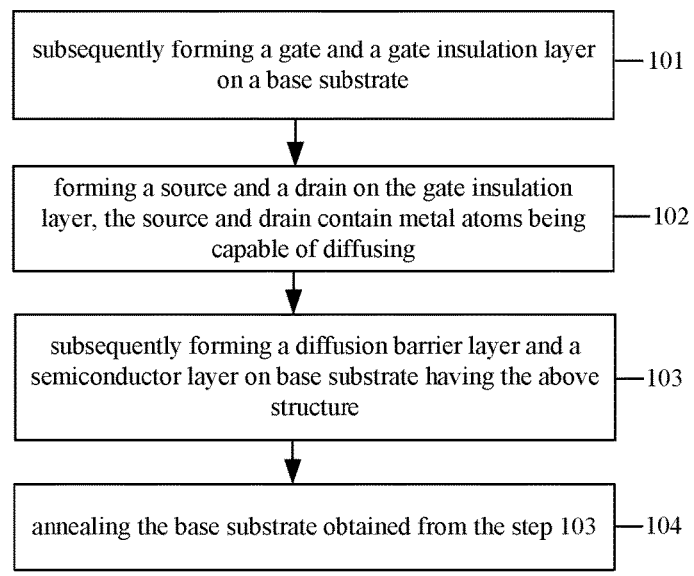
FIG. 8 is another flow chart of a method for manufacturing an array substrate according to an embodiment of the present disclosure.

Additionally, as illustrated in FIG. 8, a step 104 may be performed after the step 103, for example, the step 104 comprises:

104. annealing the base substrate obtained from the step 103.

The annealing process refers to a heat treatment process of a metal, herein, the base substrate is heated to a certain temperature, kept at the temperature for a period of time, and cooled at an appropriate rate (usually cooled slowly, and sometimes cooled by control).

In order to accelerate the diffusion rate of the metal atoms, for example, of the copper atoms, the base substrate shown in FIG. 5 is annealed at a temperature from 200° C. to 450° C., then the reaction between the copper atoms diffused from the diffusion barrier layer 15 and the amorphous silicon in the semiconductor layer 16 is accelerated, and the metal transition layer 17 containing metal silicide is formed.

An embodiment of the present disclosure provides a method for manufacturing a thin film transistor, which comprises: forming a diffusion barrier layer between a step of forming the source and drain and a step of forming the semiconductor layer; the diffusion barrier layer is configured to reduce the diffusion ability of metal atoms diffused from the source and drain to the semiconductor layer (that is, to block a part of the diffused metal atoms). In this way, the metal atoms passing through the diffusion barrier layer contact and react with the amorphous silicon in the semiconductor layer, and a metal transition layer containing metal silicide is formed at the interface of the diffusion barrier layer and the semiconductor layer. Because of the low resistivity of the metal silicide, the ohmic contact resistance formed between the semiconductor layer and the source (or the drain) of the TFT is reduced effectively, as a result, the switch-on resistance of the TFT is reduced while the aperture ratio of the display device is guaranteed, and the switch-on current of the TFT is increased.

As illustrated in FIG. 6, an embodiment of the present disclosure further provides a thin film transistor, which comprises:

a base substrate 10;

a source 13 and a drain 14 disposed on the base substrate 10;

a diffusion barrier layer 15 disposed on the source 13 and the drain 14;

a semiconductor layer 16 disposed on the diffusion barrier layer 15, herein, metal atoms passing through the diffusion barrier layer 15 react with the amorphous silicon in a part of the semiconductor layer 16 near the source 13 and the drain 14, and a metal transition layer 17 containing metal silicide is formed.

In at least some of the embodiments of the present disclosure, the source 13 and drain 14 contain metal atoms being capable of diffusing, for example, cooper atoms. The diffusion barrier layer 15 is configured to reduce the diffusion ability of metal atoms diffused from the source 13 and drain 14 to the semiconductor layer 16 to be formed in the following step. The material of the semiconductor layer 16 is amorphous silicon.

In at least some of the embodiments of the present disclosure, the thin film transistor further comprises: a gate and a gate insulation layer, or other layer structures. The configuration of the TFT may be designed by those skilled in the art according to the real situation, it is not limited in the embodiments of the invention.

For example, the semiconductor layer 16 is formed on the base substrate firstly, then the diffusion barrier layer 15 is formed on the semiconductor layer 16, and finally the source 13 and drain 14 are formed on the diffusion barrier layer 15. This configuration also allows metal atoms passing through the diffusion barrier layer 15 to react with the amorphous silicon in a part of the semiconductor layer 16 near the source 13 and drain 14, and a metal transition layer 17 containing metal silicide is formed.

An embodiment of the present disclosure further provides a method for manufacturing an array substrate, which comprises any of the above methods of manufacturing the thin film transistor.

An embodiment of the present disclosure further provides an array substrate, which comprises the above thin film transistor.

An embodiment of the present disclosure further provides a display device, which comprises the above array substrate.

The display device may be a liquid crystal display panel, an electronic paper display panel, an OLED display panel, a mobile phone, a tablet computer, a TV, a display, a notebook computer, a digital photo frame, a navigation equipment or any other product or component with display function.

Embodiments of the present disclosure provide a thin film transistor, an array substrate, a method for manufacturing the same, and a display device. A diffusion barrier layer is formed between the source/drain and the semiconductor layer. The diffusion barrier layer is configured to reduce the diffusion ability of metal atoms diffused from the source and drain to the semiconductor layer; in this way, metal atoms passing through the diffusion barrier layer contact and react with the amorphous silicon in the semiconductor layer, and a metal transition layer containing metal silicide is formed at the interface of the diffusion barrier layer and the semiconductor layer. Because of the low resistivity of the metal silicide, the ohmic contact resistance formed between the semiconductor layer and the source-drain of the TFT is reduced effectively, as a result, the switch-on resistance of the TFT is reduced while the aperture ratio of the display device is guaranteed, and the switch-on current of the TFT is increased.

The specific features, structures, materials, or characteristics described in the disclosure may be combined in any one or more embodiments or examples in a suitable way.

What is described above is related to the illustrative embodiments of the disclosure only and not limitative to the scope of the disclosure; the scopes of the disclosure are defined by the accompanying claims.

The present application claims the priority of Chinese patent application No. 201510332661.9 filed on Jun. 15, 2015, the disclosure of which is incorporated by reference herein in its entirety.

The invention claimed is:

1. A method for manufacturing a thin film transistor, comprising:

forming a source and drain on a base substrate;

forming a semiconductor layer; and between forming the source and drain and forming the semiconductor layer, the method further comprises:

forming a diffusion barrier layer, wherein metal atoms diffused from the source and drain and passing through the diffusion barrier layer react with a part of the semiconductor layer near the source and drain, and a metal transition layer containing metal silicide is formed, wherein the metal silicide comprises the metal atoms diffused from the source and drain, wherein the source and drain is separated from the metal transition layer by the diffusion barrier layer, and wherein the part of the semiconductor layer is configured to become the metal transition layer, and another part of the semiconductor layer is configured to be an active layer of the thin film transistor.

2. The method for manufacturing the thin film transistor according to claim 1, wherein a material of the semiconductor layer is amorphous silicon.

3. The method for manufacturing the thin film transistor according to claim 2, wherein the diffusion barrier layer is formed between the source and drain and the semiconductor layer, and the diffusion barrier layer is configured to block a part of the metal atoms diffused from the source and drain to the semiconductor layer.

4. The method for manufacturing the thin film transistor according to claim 1, wherein the metal transition layer is formed in the part of the semiconductor layer near the diffusion barrier layer.

5. The method for manufacturing the thin film transistor according to claim 1, wherein the metal atoms are copper atoms.

6. The method for manufacturing the thin film transistor according to claim 2, wherein a material of the diffusion barrier layer comprises at least one of tantalum nitride, titanium nitride, molybdenum nitride, silicon oxynitride, or silicon oxide.

7. The method for manufacturing the thin film transistor according to claim 2, wherein after forming the diffusion barrier layer, the method further comprises:
   annealing the base substrate on which the source and drain, the diffusion barrier layer and the semiconductor layer are formed, such that the reaction between the metal atoms passing through the diffusion barrier layer and the amorphous silicon in the semiconductor layer is accelerated, and the metal transition layer containing metal silicide is formed.

8. The method for manufacturing the thin film transistor according to claim 7, wherein the base substrate is annealed at a temperature from 200° C. to 450° C.

9. The method for manufacturing the thin film transistor according to claim 1, wherein the source and drain, the semiconductor layer, and the diffusion barrier layer is formed in this order:
   forming the source and drain on the substrate;
   forming the diffusion barrier layer overlaying the source and drain; and
   forming the semiconductor layer on the diffusion barrier layer.

10. A method for manufacturing an array substrate, comprising the method for manufacturing the thin film transistor according to claim 1.

11. A thin film transistor, comprising:
   a base substrate;
   a source and drain disposed on the base substrate;
   a diffusion barrier layer disposed on the source and drain; and
   a semiconductor layer disposed on the diffusion barrier layer, wherein metal atoms diffused from the source and drain and passing through the diffusion barrier layer react with a part of the semiconductor layer near the source and drain, and a metal transition layer containing metal silicide is formed,
   wherein the metal silicide comprises the metal atoms diffused from the source and drain,
   wherein the source and drain is separated from the metal transition layer by the diffusion barrier layer, and
   wherein the part of the semiconductor layer is configured to become the metal transition layer, and another part of the semiconductor layer is configured to be an active layer of the thin film transistor.

12. The thin film transistor according to claim 11, wherein a material of the semiconductor layer is amorphous silicon.

13. The thin film transistor according to claim 12, wherein the diffusion barrier layer is configured to block a part of the metal atoms diffused from the source and drain to the semiconductor layer.

14. The thin film transistor according to claim 11, wherein the metal transition layer is formed in the part of the semiconductor layer near the diffusion barrier layer.

15. An array substrate, comprising the thin film transistor according to claim 11.

16. A display device, comprising the array substrate according to claim 15.

17. The method for manufacturing the thin film transistor according to claim 1, wherein the part of the semiconductor layer is nearer to the source and drain than to a gap between the source and drain.

18. The thin film transistor according to claim 11, wherein the part of the semiconductor layer is nearer to the source and drain than to a gap between the source and drain.

* * * * *